United States Patent [19]

Röschmann

[11] Patent Number: 4,775,837
[45] Date of Patent: Oct. 4, 1988

[54] SURFACE COIL FOR HIGH-FREQUENCY MAGNETIC FIELDS FOR MAGNETIC RESONANCE EXAMINATIONS

[75] Inventor: Peter Röschmann, Hamburg, Fed. Rep. of Germany

[73] Assignee: U.S. Philips Corp., New York, N.Y.

[21] Appl. No.: 58,293

[22] Filed: Jun. 5, 1987

[30] Foreign Application Priority Data

Jun. 13, 1986 [DE] Fed. Rep. of Germany ....... 3619970

[51] Int. Cl.⁴ .................................... G01R 33/20
[52] U.S. Cl. ................................ 324/322; 324/318
[58] Field of Search .............. 324/300, 307, 309, 318, 324/322; 128/653

[56] References Cited

U.S. PATENT DOCUMENTS

| 4,590,947 | 5/1986 | Krause | 324/318 |
| 4,620,155 | 10/1986 | Edelstein | 324/322 |
| 4,621,237 | 11/1986 | Timms | 324/318 |
| 4,682,112 | 7/1987 | Beer | 324/322 |
| 4,691,163 | 9/1987 | Blass et al. | 324/318 |

Primary Examiner—Michael J. Tokar
Attorney, Agent, or Firm—Jack E. Haken

[57] ABSTRACT

A surface coil for magnetic resonance examinations which serves to generate or receive high-frequency magnetic fields. The loop forming the surface coil is divided into at least two, preferably equal loop sections. At least the loop section to be coupled to the high-frequency receiver or high-frequency generator comprises two inner conductors which are accommodated in an outer conductor arrangement and one part of which extends (at the center of this loop section) to the high-frequency generator or high-frequency receiver, its other part being connected to the other loop section. A capacitive coupling is obtained between the loop sections so that a high-frequency alternating current can flow in the loop formed by the loop sections, said current producing a high-frequency magnetic field.

10 Claims, 3 Drawing Sheets

SURFACE COIL FOR HIGH-FREQUENCY MAGNETIC FIELDS FOR MAGNETIC RESONANCE EXAMINATIONS

The invention relates to a surface coil for high-frequency magnetic fields for magnetic resonance examinations, comprising a loop which is divided into at least two capacitively coupled sections.

A surface coil of this kind is known from the Book of Abstracts, Vol. 2, Society of Magnetic Resonance in Medicine, Fourth Annual Meeting, Aug. 19-23, 1985, London, pages 1084 and 1085 as well as pages 1117 and 1118.

Surface coils of this kind can be used for magnetic resonance examinations, notably for medical purposes, for generating high-frequency magnetic fields or for receiving spin resonance signals. Notably in the case of medical applications, they are arranged on the surface of a body to be examined, so that their quality factor is reduced. From the cited publications it is known that the quality factor of a coil can be improved by dividing the loop forming the coil into at least two capacitively coupled sections.

The application (or extraction) of the high-frequency energy usually takes place at the gap between two neighbouring loop sections, that is to say via a tuning and matching network. A variation in the matching and tuning causes electrical asymmetry, so that the coil quality factor is reduced. A further drawback of the known device consists in that width of the gaps must be sufficient to accommodate the necessary capacitors between the two loop sections, said capacitors requiring a comparatively high electric strength, notably when the surface coil is used as a transmission coil, so that they are comparatively large. Therefore, comparatively strong distortions of the field distribution occur at the area of the gap.

It is the object of the present invention to propose an attractive construction for a surface coil of the kind set forth.

This object is achieved in accordance with the invention in that one loop section comprises an outer conductor which encloses two inner conductors which are insulated therefrom, each of the inner conductors having a part which extends symmetrically with respect to said loop section, the other part being in each case conductively connected to the conductor or conductors of the neighbouring loop section or loop sections.

In accordance with the invention, the capacitance between two loop sections is formed by the capacitance of the inner conductor, projecting from the outer conductor, with respect to the associated outer conductor. As a result, the seperating zones or clearances between neighbouring loop sections may be comparatively narrow, for example from 2 to 3 mm. As a result, only minor distortions of the electromagnetic fields will occur at the gaps.

In the surface coil in accordance with the invention, a field distribution is obtained which is symmetrical with respect to the centres of the loop sections. Therefore, these centres may be considered to be virtual ground points. Electrical components or conductors operating at the area of these ground points have hardly any effect on the field distribution of the surface coil, so that the high-frequency supply leads for the coil, being situated at the area of these virtual ground points in the surface coil in accordance with the invention, do not influence the symmetry of the field distribution. The better this symmetry, the lower the dielectric losses will be and the better undesirable so-called sheath waves on the high-frequency conductors will be suppressed. These sheath waves can propagate in the space between the sheath of the high-frequency supply lead and conductive surfaces (for example, a Faraday shield) within a magnetic resonance imaging apparatus. However, when the high-frequency supply lead of the coil is arranged at a virtual ground point, as in the case of the invention, sheath waves of this kind cannot be excited.

A circular of rectangular shape is a suitable shape of the loop forming the surface coil. However, other shapes are also feasible; it is merely necessary for the shape to be symmetrical with respect to a symmetry plane which perpendicularly intersects said one loop section at its centre.

A surface coil generally comprises only a single loop. However, it is alternatively possible to construct a surface coil by means of two adjacently arranged loops which have one loop section in common and which generate two magnetic fields which oppose one another and which are directed perpendicularly to the plane of the loop, said magnetic fields being effective only in the near range and compensating one another in the far range.

In a preferred embodiment in accordance with the invention, said one loop section comprises two approximately equally long coaxial leads, approximately equally long parts thereof together forming said one loop section, the remaining parts of the coaxial leads extending adjacently and symmetrically with respect to said one loop section. The high-frequency generator or receiver or a matching and tuning network can be connected to the end of the remaining parts of the coaxial leads which is situated at some distance from the loop, without the field distribution of the surface coil being substantially influenced, thereby.

The invention will be described in detail hereinafter with reference to the accompanying diagrammatic drawing. Therein:

Figure 1:
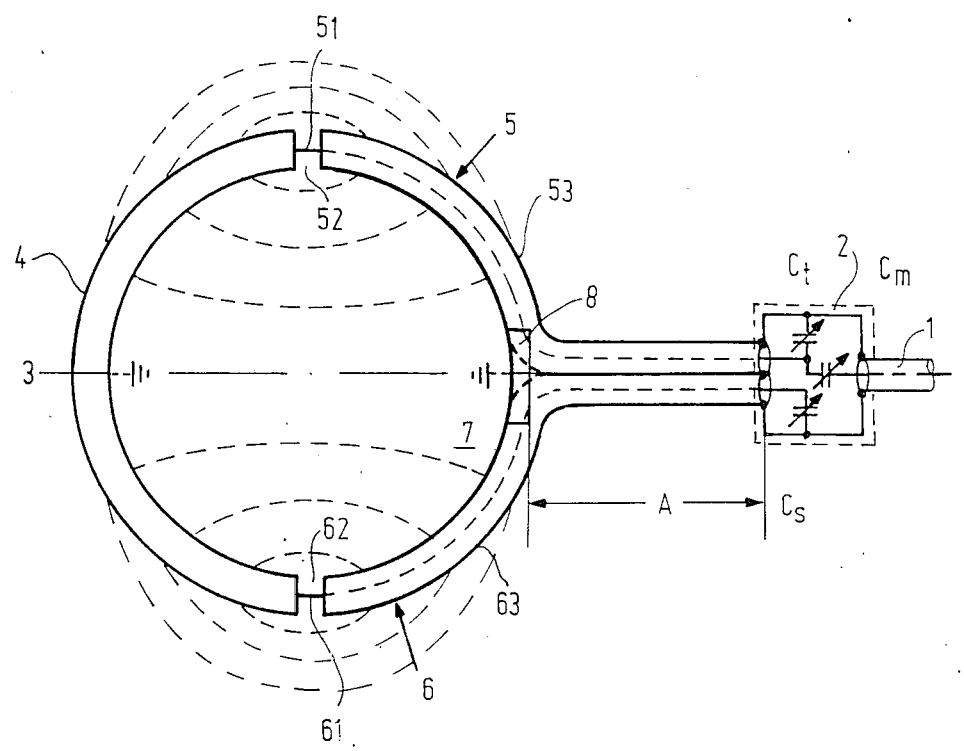
FIG. 1 shows an embodiment comprising a bipartite circular loop.

The surface coil shown in FIG. 1 comprises a bipartite circular loop. One loop section 7 is formed by two equally long coaxial cables 5 and 6, one part of each being bent so as to be quadrantal, so that both parts together form approximately a semi-circle. The remaining parts of the two coaxial cables 5 and 6 extend adjacently and symmetrically with respect to the semi-circle. The other loop section 4 is also shaped as a semi-circle and consists of a conductive tube or a solid conductor of, for example, copper. The outer diameter of the loop section 4 corresponds to the diameter of the outer conductors 53 and 63 of the coaxial cables 5 and 6, respectively.

The loop section 4 is connected to the end of the inner conductor 51, 61 of the coaxial cable 5, 6, respectively, which projects from the outer conductor 53, 63, respectively, of the coaxial cable 5, 6, respectively. Between the ends of the outer conductor 53, 63 on the one side and the loop section 4 on the other side a gap of approximately from 2 to 3 mm remains; this gap can be filled with a plastics in order to improve the mechanical stability of the surface coil.

The end of the inner conductor 51 which is remote from the loop section 4 is connected, via a matching capacitor Cm, to the inner conductor of a further coaxial cable 1 which is connected to the input of a high-frequency receiver or high-frequency generator (not shown). Moreover, between the inner conductor 51 and the outer conductor 53 of the coaxial cable 5 there is connected a tuning capacitor Ct. Between the inner conductor 61 and the outer conductor 63 of the other coaxial cable 6 there is connected a capacitor Cs whose capacitance corresponds at least approximately to the sum of the capacitances of the capacitors Ct and Cm. As a result, the two inner conductors 51 and 61 are capacitively loaded in the same sense. Preferably, the capacitors are arranged in an electrically conductive, grounded shield 2 which is conductively connected to the outer conductors of the coaxial cables 1, 5 and 6.

The capacitance acting between the loop sections 4 and 7 corresponds to the capacitance between the inner conductors 51, 61, connected to the loop section 4, and the associated outer conductor 53, 63, respectively; further increased by the capacitors Ct, Cm and Cs, respectively. Therefore, when for example electromagnetic fields are generated by the surface coil, the generator voltage acts across the gaps 52 and 62 between the loop sections 4 and 7. This results in a distribution of the electrical field lines which is symmetrical with respect to a symmetry plane 3 as denoted by broken lines. The symmetry plane 3, also being a geometrical symmetry plane, interconnects the centres of the loop sections 4 and 7; the part of each coaxial cable 5 and 6 which is bent away from the loop section 7 adjoins, by way of its outer conductor, the symmetry plane perpendicular to the plane of drawing in FIG. 1. Therefore, the areas of intersection of this symmetry plane with the loop 4, 7 are free from electrical fields and may be considered to be virtual ground points. Electrical conductors situated at this area, inter alia the shield 2 and the part of the coaxial cables 5 and 6 leading to the loop section 7, thus have substantially no effect on the field distribution in the coil. Therefore, the excitation of the so-called sheath waves at this area is suppressed or, considering the unavoidable symmetry errors occurring in practice, substantially reduced in comparison with a coil in which the high-frequency supply lead is routed directly to the gap, that is to say to a location where a high-electrical field strength prevails.

The resonant frequency of the surface coil as well as the matching are influenced to a different extent by the position of the coil with respect to the body of the patient and by the properties of the tissues of the patient during magnetic resonance imaging. Therefore, the capacitor Cs is preferably adjusted once for a mean patient load and for a predetermined resonant frequency, the exact adjustment of the resonant frequency and the matching being performed for each examination by adjustment of the capacitors Ct and Cm. The slight electrical symmetry errors then occurring can be ignored when use is made of the coil construction in accordance with the invention.

On the one hand, the length of the two coaxial cables should not be substantially larger than $\frac{1}{8}$ of the wavelength in the cable at the resonant frequency, and the distance A between the adjacently situated ends of the coaxial cables and the centre of the loop 7 should be between 20 and 200 mm. The distance A can be adjusted over a wide range for different loop diameters and resonant frequencies by way of a suitable choice of the thickness of the conductor loops, the external capacitors Ct, Cs and Cm, the inner diameter of the outer conductor and the outer diameter of the inner conductor of this cable and the dielectric.

Because of their mechanical stability, notably so-called solid-sheath cables which are preferably made of copper are very suitable for use as the coaxial cables 5 and 6. The bending radii at the area where the parallel arranged cables change over into the loop cause a niche which could lead to an undesirable field distortion. This can be avoided by means of a bridge member 8 of, for example, copper foil which conductively bridges the outer conductors of the two coaxial leads.

Figure 2A:
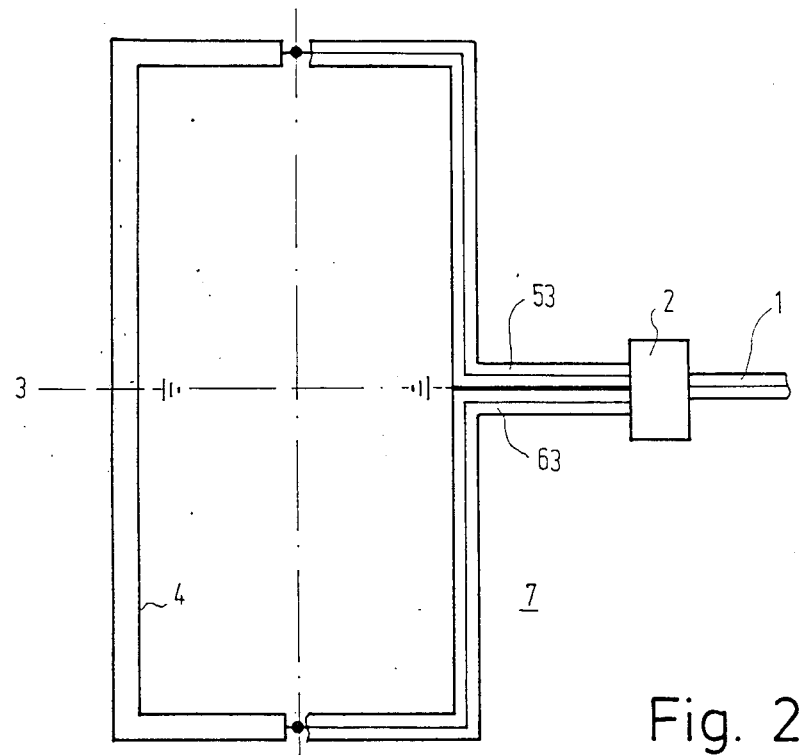
FIGS. 2a and 2b show an embodiment comprising a rectangular loop.
Figure 2B:
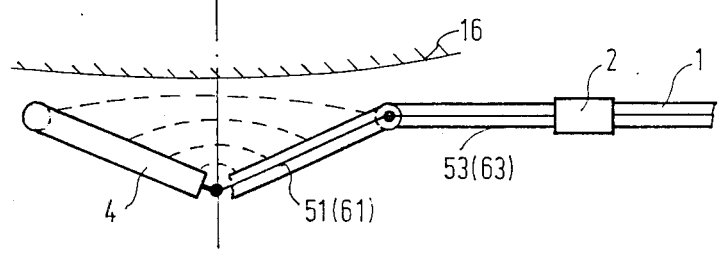

FIGS. 2a and 2b again show a surface coil comprising a bipartite loop which, however, has a rectangular shape so that two rectangular loop sections are obtained which are symmetrically situated with respect to the centre line 3. As appears notably from FIG. 2b, the inner conductor 51, 61 is connected to the conductor 4 via an electrically conductive swivel. The area of high electric field strengths can be kept remote from the patient 16 by bending the conductor loop in the two gaps, so that the dielectric losses in the patient are reduced. When the angle between the two loop sections 4 and 7 is varied, the inductance of the loop is also varied. Therefore, this embodiment enables readjustment of the frequency by variation of the angle, without the adjustment of the tuning capacitor (and hence the electrical symmetry of the circuit) being changed. By larger angular variations the width of the zone in which a high-frequency magnetic field is produced by means of the surface coil can be substantially influenced and hence adapted to desired imaging zones of the body.

Figure 3:
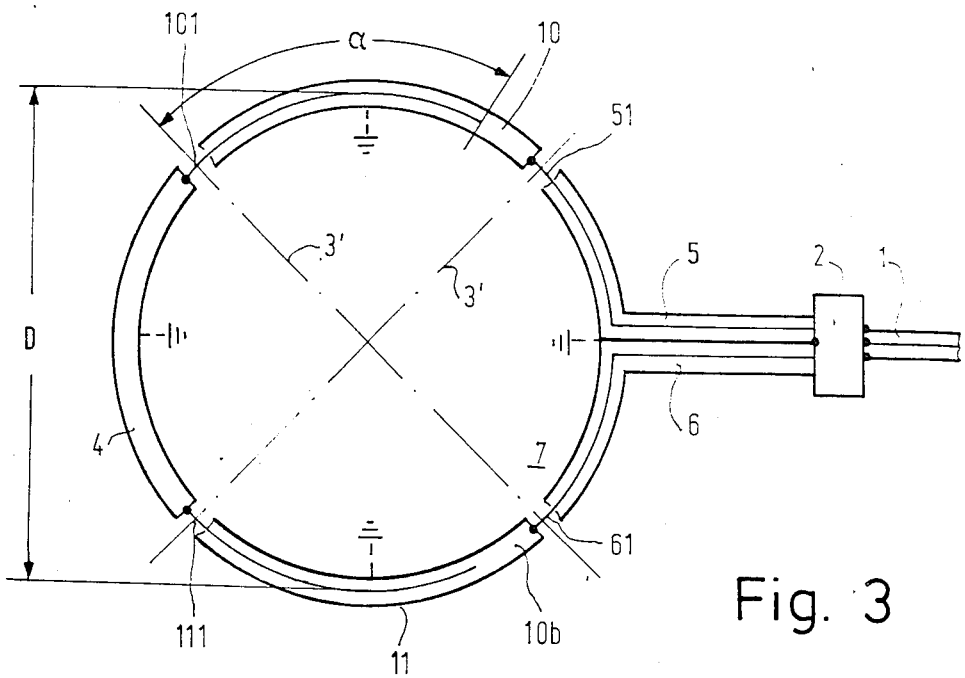
FIG. 3 shows a first embodiment comprising a quadripartite circular loop.

FIG. 3 shows a surface coil having a quadripartite circular loop. Each loop section corresponds to an arc of circle of approximately 90°. The loop section 7 which is connected to the high-frequency generator or receiver is connected, by way of its two inner conductors 51 and 61, to the outer conductor of a neighbouring loop section 10, 11, respectively, which encloses an inner conductor 101, 111, respectively. The two inner conductors 101, 111 are connected to the fourth loop section 4 (a solid conductor portion). In order to obtain a symmetrical arrangement, the capacitances between the loop sections 10 and 11 and the loop section 4 must be equal to the capacitances between the loop sections 10 and 11 and the loop section 7. To achieve this, the cables used to form the loop sections 10 and 11 must have the same construction and a higher capacitance per unit of length than the coaxial leads used in the loop section 7. In the case of complete electrical symmetry of the arrangement, existing for only a single frequency, two symmetry planes 3' are obtained which extend through oppositely situated gaps, so that the relevant centres of the loop sections can be considered as virtual ground.

The loop section 7 can in principle be constructed in the same way as the corresponding loop section of FIG. 1, the only difference being that it corresponds to a quarter circle instead of a semi-circle. The construction of the loop section 7 shown in FIG. 1, however, necessitates the presence of coaxial leads which may be deformed with a sufficiently small bending radius, for example 15 mm or less. In the case of larger bending radii, it makes sense to use a circular outer conductor comprising two separate inner conductors which are connected, at the area of the centre of the arc of circle, to two coaxial cables 5 and 6 which extend approximately perpendicularly with respect thereto.

Figure 4:
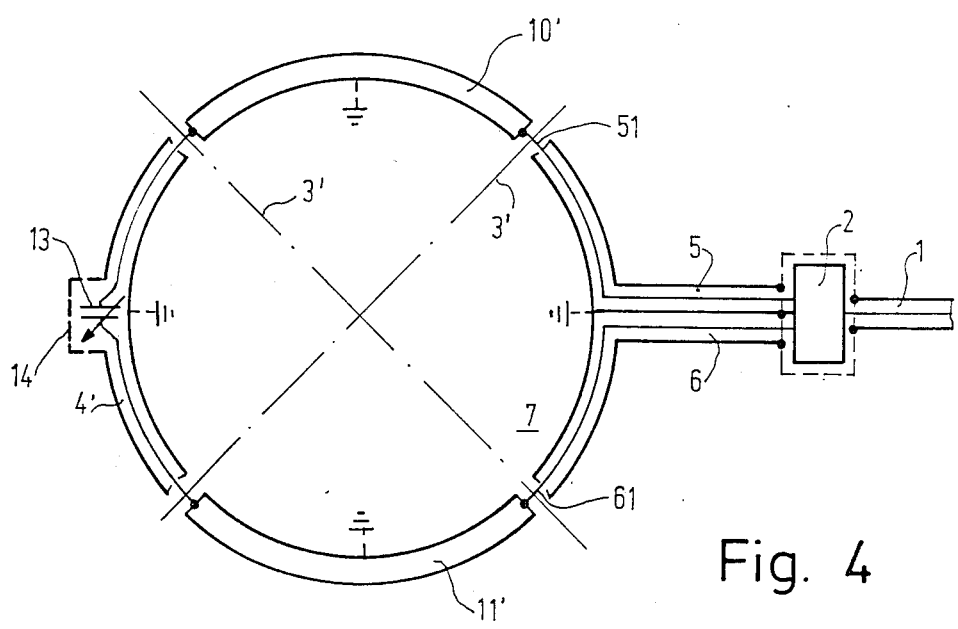
FIG. 4 shows a second embodiment comprising a quadripartite circular loop.

FIG. 4 shows a further surface coil comprising a quadripartite circular loop. The inner conductors 51, 61, however, are connected to loop sections 10' and 11', respectively, which do not comprise an inner conductor but which consist instead of a solid copper conductor or a copper tube. The fourth loop section 4' again consists of a coaxial arrangement whose inner conductors, however, are separated at the centre and are connected to a variable capacitor 13. The capacitance thereof is proportioned so that the same capacitance acts across the gaps between the loop sections 4' and 10' and 4' and 11', respectively, as across the gaps between the loop sections 7 and 10' and 7 and 11', respectively. In order to shield electrical fields from the patient at the area of the capacitor 13, it can be electrically shielded by means of a widened portion 14 of the cable sheath. However, it is alternatively possible to leadout the inner conductors of the fourth loop section in the same way as for the loop section 7 and to interconnect the ends of the inner conductors via a correspondingly proportioned capacitor, so that symmetry is obtained.

The invention has been described with reference to embodiments comprising two or four loop sections. However, the invention can also be realized with a different number of loop sections, notably also an odd number.

What is claimed is:

1. A surface coil for high-frequency magnetic fields for magnetic resonance examinations, comprising at least one loop which is divided into at least two capacitively coupled sections (4, 7), wherein one loop section (7) comprises an outer conductor (53, 63) enclosing two inner conductors (51, 61) insulated therefrom, each of said inner conductors having a first part which extends symmetrically with respect to said loop section and a second part conductively connected to a conductor of the neighbouring loop section (4) or loop sections (10, 11).

2. A surface coil as claimed in claim 1, wherein the outer conductors (53, 63) of said loop section (7) and the conductor of the neighboring loop section have approximately the same diameter.

3. A surface coil as claimed in claim 1 wherein said one loop section (7) comprises two approximately equally long coaxial leads (5, 6), approximately equally long parts thereof together forming said one loop section (7), the remaining parts of the coaxial leads (5, 6) extending adjacently and symmetrically with respect to said one loop section (7).

4. A surface coil as claimed in claim 3 further comprising a matching and tuning network (Cm, Ct, Cs) connected to the part of the coaxial leads which are remote from said one loop section.

5. A surface coil as claimed in claim 4 wherein the matching and tuning network is arranged within an electrical shield (2) which is conductively connected to the outer conductors (53, 63) of the coaxial leads (5, 6).

6. A surface coil as claimed in claim 3 further comprising a bridge member (8) which electrically conductively bridges the outer conductors of the two coaxial leads at the area where they change-over into said one loop section.

7. A surface coil as claimed in any of the claims 1-3, 4-6, wherein the inner conductor (51, 61) is provided with a swivel outside said one loop section (7) so that the planes of the two loop sections (4, 7) can be swiveled with respect to one another.

8. A surface coil as claimed in any of the claims 1-3, 4-6 wherein the loop is divided into an even number of at least four equally long loop sections (4, 7, 10, 11), the inner conductors (51, 61) of said one loop section (7) being connected to the outer conductors of the neighbouring loop sections (10, 11), the outer conductors of the neighbouring loop sections each enclosing an inner conductor (101, 111) which itself is connected, at the end which is remote from said one loop section (7), to an additional neighbouring loop section, a further loop section (4) being provided at the side of the loop which is situated opposite said one loop section (7), the conductors of said further loop section being connected to the inner conductors of the two loop sections adjacent thereto (FIG. 3).

9. A surface coil as claimed in any of the claims 1-3, 4-6, wherein the loop is divided into an even number of at least four loop sections, a further loop section (4') being situated opposite said one loop section (7) and comprising an inner conductor and an outer conductor, said further loop section being constructed so that the capacitance acting between the inner conductor and the outer conductor is at least approximately equal to the corresponding capacitances of said one loop section, its inner conductor being connected to the conductors of the neighbouring loop sections (10', 11') at both sides.

10. A surface coil as claimed in claim 1 wherein there is connected to the parts of the inner conductors (51, 61) emerging from said one loop section (7) on the one side a tuning capacitor and a matching capacitor (Ct, Cm) and on the other side a symmetry capacitor whose capacitance corresponds to the sum of the capacitances of the tuning capacitor and the matching capacitor, so that the same capacitive loading of both inner conductors is obtained.

* * * * *